United States Patent [19]

Riedel

[11] 4,289,361

[45] Sep. 15, 1981

[54] ENCLOSURE FOR METERS

[75] Inventor: Ronald J. Riedel, Diamond Bar, Calif.

[73] Assignee: Ryco Mfg. Co., Industry, Calif.

[21] Appl. No.: 57,953

[22] Filed: Jul. 16, 1979

[51] Int. Cl.³ .......................... H02B 9/00; H02B 1/12
[52] U.S. Cl. .................................. 312/100; 312/229; 361/365
[58] Field of Search .................. 312/100, 229; 174/37, 174/50 R, 52 R; 361/365, 366

[56] References Cited

U.S. PATENT DOCUMENTS

| 2,615,775 | 10/1952 | Claybourn et al. | 312/100 |
| 3,365,535 | 1/1968 | Wilk | 312/100 |
| 3,617,814 | 11/1971 | Stanback | 361/365 |
| 3,675,085 | 7/1972 | Stanback | 312/100 X |
| 4,133,021 | 1/1979 | King et al. | 312/100 |

Primary Examiner—Casmir A. Nunberg
Attorney, Agent, or Firm—Boniard I. Brown

[57] ABSTRACT

An enclosure for multiple utility meter such as normally are installed at the rear of commercial buildings including modular sections partitioned by panels in the front thereof, said panels overlapping so that a wrap-around structure is provided to prevent the entry of water or like substances therein.

11 Claims, 5 Drawing Figures

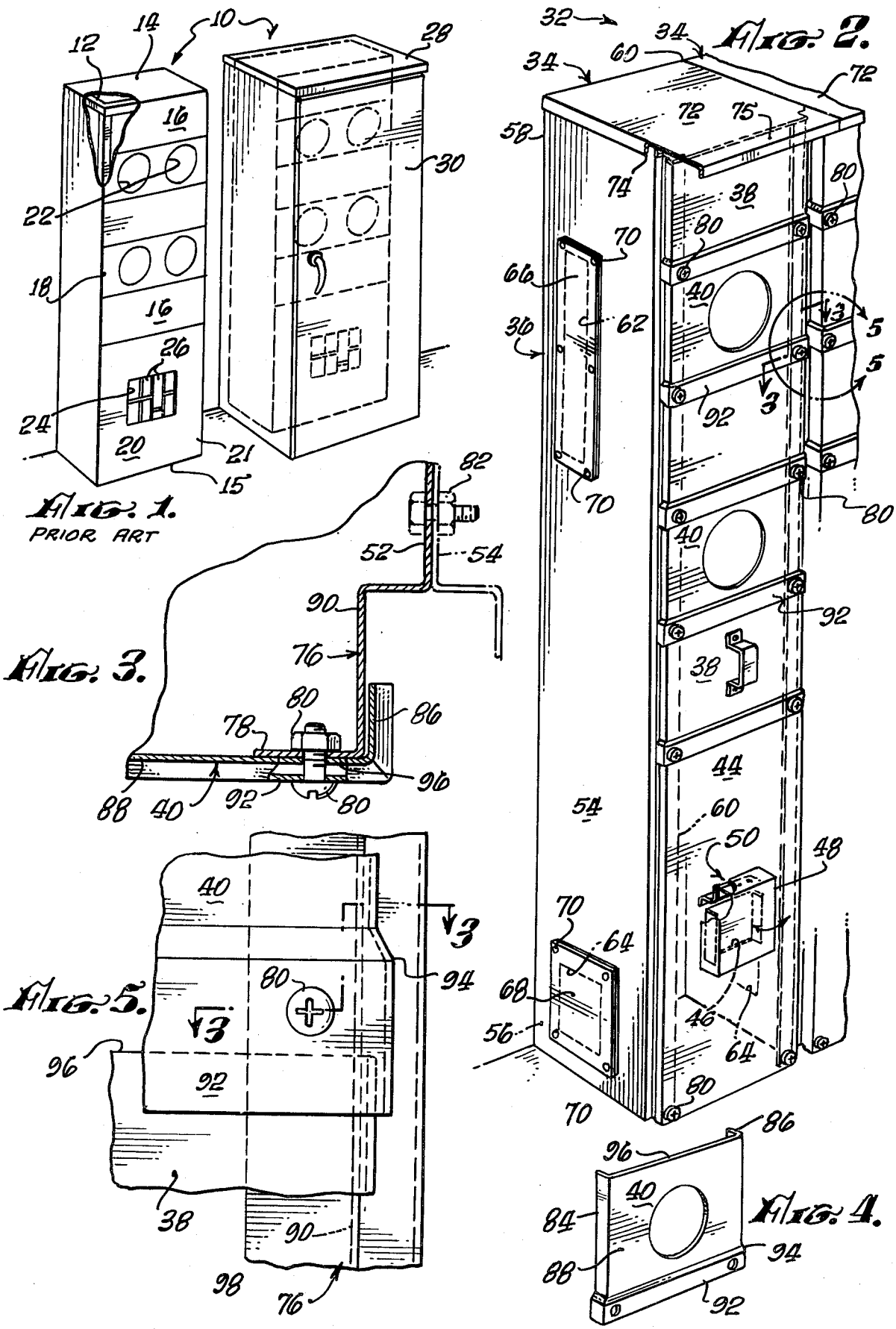

ENCLOSURE FOR METERS

BACKGROUND OF THE INVENTION

It is usual that a single feeder line is used to feed multiple utility lines to various commercial establishments in a shopping center and that each shop or business in the center have a separate utility meter so that the charges for electricity can be properly distributed. These meters are usually mounted in enclosures or housings which include a frame which has various support panels fastened thereto. If the frame is to be used out of doors it must be enclosed in a water tight box with a door to prevent the entry of water behind the meter where high voltages may be present.

BRIEF DESCRIPTION OF THE PRESENT INVENTION

The present invention eliminates the need for separate exterior housings, and eliminates the frame structure previously required by providing a "wrap-around" structure which is essentially modular in construction. The present invention includes a modular box structure having meter supporting panels which close the face thereof. The panels each have a lower "overlap" lip to prevent the entry of rain water or other fluids which might be present adjacent thereto. The box provides a shield for the top and can be adapted to various kinds of meters, fuse panels and the like and yet because of its modular construction, it is relatively easy and economical to manufacture and purchase.

It is an object of the present invention to provide more economic means for supporting utility meters.

Another object is to provide a modular utility meter housing which can be used either indoors or out.

Another object is to provide a modular utility housing which is relatively rigid yet can be modified easily to increase or reduce the number of meters supported thereby.

These and other objects of the present invention will become apparent to those skilled in the art after considering the following detailed specification in which is described a preferred embodiment thereof in conjunction with the accompanying drawing wherein:

BRIEF DESCRIPTION OF THE DRAWING

FIG. 1 is a perspective view, partially in cross-section, of interior and exterior prior art meter housings;

FIG. 2 is a perspective view showing a module constructed according to the present invention attached to a portion of another module;

FIG. 3 is an enlarged cross-sectional view taken at line 3—3 of FIG. 2;

FIG. 4 shows a single face panel for the present invention; and

FIG. 5 is an enlarged detail view taken in the area of 5—5 of FIG. 2.

DETAILED DESCRIPTION OF THE SHOWN EMBODIMENT

Referring to the drawing, more particularly by reference numbers, number 10 in FIG. 1 refers to meter enclosures 10 constructed according to the prior art. Typically the prior art enclosures 10 are constructed from a frame 12, covered by sheet metal about the top 14 and in some instances the bottom 15 thereof. The enclosures include cover plates 16, 18 and 20 on the front 21 thereof: with cover plate 16 being a dummy plate; cover plates 18 having holes 22 for mounting meters therethrough; and plate 20 having an opening 24 for circuit breakers 26. When used outside, such prior art devices require a protective cabinet 28 with some sort of opening cover like the door 30 shown, to prevent the elements from passing about the plates 16, 18 and 20 and causing problems with the circuits behind the plates.

The enclosure 32 does not require a container for use outside a structure and is comprised of one or more modules 34 which include a metal structure 36 and a plurality of panels: which may be dummy panels 38; panels 40 having an opening 42 for receiving a utility meter; and a fuse or circuit breaker accomodating panel 44, having an opening 46 therethrough over which a gasketed cover plate 48 is hingedly mounted by a hinge assembly 50 including a step shaped bracket.

It is preferable that the sides 52 and 54 and the back 56 of the structure 36 be constructed from a single piece of sheet metal bent into the shape shown in FIG. 2. It is also possible to construct the structure 36 from three separate pieces of sheet metal joined at the corners 58 and 60 therebetween by suitable means such as welding. The sides 52 and 54 include upper and lower openings 62 and 64 to provide access between adjacent modules 34 when they are positioned and connected together as shown in FIG. 2. When the module 34 is the end module, suitably gasketed cover plates 66 and 68 are provided to cover the openings 62 and 64 respectively. The cover plates 66 and 68 can be retained in position by any suitable means such as the screws 70 shown.

The top of the module 34 is enclosed by an overhanging top sheet 72 which preferably is attached to the sides 52 and 54 and the back 56 by weld 74. The top sheet 72 includes an forwardly extending overhang portion 75 for protecting the panels 38, 40, and 44 from the elements.

As shown in FIG. 3, the front edges of each of the sides 52 and 54 are formed into a step shaped flange 76 whose front surface 78 provides the attachment points for the panels 38, 40, and 44 which are retained thereto by suitable fasteners such as bolts and nuts 80. Similar bolts and nuts 82 can be used to retain the sides 52 and 54 of adjacent modules 34 together.

As can be seen in FIG. 4, the panels such as panel 40 are provided with a pair of side flanges 84 and 86 which extend rearwardly from the front face 88 thereof. The distance between the flanges 84 and 86 is chosen to be just larger than the distance between the center sections 90 of the step shaped flanges 76 of a module 34 so that the panels can nest thereover as shown in FIG. 3. Each panel 38, 40 and 44 also includes a skirt 92 which flairs outwardly at the bottom 94 thereof. The skirt 92 therefore is adapted to fit over the top edge 96 of the lower adjacent panel as shown in FIG. 5 to prevent the elements from entering the module 34.

Thus there has been shown and described a novel modular meter housing which fulfills all of the objects and advantages sought therefor. Many changes, modifications, uses and applications of the subject invention will become apparent to those skilled in the art after considering this specification and the accompanying drawing. All such changes, modifications, alterations and other uses and applications which do not depart from the spirit and scope of the invention are deemed to be covered by the invention which is limited only by the claims which follow.

What is claimed is:

1. An enclosure for utility meters and the like comprising:
at least a first module which includes a structure having a front, first and second side portions, a back portion and a top portion; and a plurality of panels closing said front thereof, said first and second side portions respectively including first and second step shaped members adjacent to said front, each step shaped member having a first planar surface extending toward the other step shaped member, said step shaped members each including a center section and a front section, said panels including rearwardly extending side flanges cooperating with said center sections.

2. The enclosure as defined in claim 1 wherein said first planar surfaces are disposed in coplanar relationship and engage one of said panels, said module including fastener means for removably retaining said panels to said first planar surfaces.

3. The enclosure as defined in claim 2 wherein at least one of said panels has a lower portion forming a skirt which extends outwardly and downwardly and is dimensioned and configured to cover an adjacent panel which is disposed at a lower elevation.

4. The enclosure as defined in claim 3 wherein each module is elongated and further includes a second module which is generally similar to said first module and disposed adjacent to said first module in aligned side by side relationship; means to retain one of said side portions of said first module and one of said side portions of said second module together.

5. The enclosure as defined in claim 4 wherein said first and second side portions include openings therethrough at predetermined locations therealong, whereby said openings are aligned on adjacent modules for the passage of wires, pipes and the like therebetween.

6. The enclosure as defined in claim 5 further including a gasketed cover positioned over at least one of said openings which is positioned on a side of said enclosure, and fastener means to retain said cover to said structure.

7. The enclosure as defined in claim 6 wherein at least one of said panels is adapted to cover a portion of said front by itself.

8. The enclosure as defined in claim 6 wherein at least one of said panels is dimensioned and configured to retain a utility meter therethrough in position to be read.

9. The enclosure as defined in claim 6 wherein at least one of said panels is dimensioned and configured to retain at least one circuit breaker.

10. The enclosure as defined in claim 2 wherein said side flange of each panel includes outer surfaces spaced apart a distance which is less than the distance between said first and second side portions measured behind said step shaped edges thereof.

11. The enclosure as defined in claim 3 wherein said top portion includes a forwardly extending lip which extends like a cantilever beyond said panel.

* * * * *